United States Patent [19]
Botez et al.

[11] Patent Number: 5,953,356
[45] Date of Patent: Sep. 14, 1999

[54] INTERSUBBAND QUANTUM BOX SEMICONDUCTOR LASER

[75] Inventors: Dan Botez, Madison, Wis.; Peter S. Zory; Chia-Fu Hsu, both of Gainesville, Fla.

[73] Assignee: Wisconsin Alumni Research Foundation, Madison, Wis.

[21] Appl. No.: 08/964,244

[22] Filed: Nov. 4, 1997

[51] Int. Cl.⁶ .................................................. H01S 3/19
[52] U.S. Cl. ............................................. 372/45; 372/43
[58] Field of Search ................................ 372/45, 46, 43; 257/14, 15

[56] References Cited

U.S. PATENT DOCUMENTS

| | | | |
|---|---|---|---|
| 4,748,132 | 5/1988 | Fukuzawa et al. | 438/45 |
| 4,802,181 | 1/1989 | Iwata | 372/45 |
| 4,983,540 | 1/1991 | Yamaguchi et al. | 257/15 |
| 5,113,072 | 5/1992 | Yamaguchi et al. | 250/309 |
| 5,123,804 | 6/1992 | Nagai et al. | 257/14 |

OTHER PUBLICATIONS

Jasprit Singh, "Possibility of Room Temperature Intra–Band Lasing in Quantum Dot Structures Placed in High–Photon Density Cavities," IEEE Photonics Technology Letters, vol. 8, No. 4, Apr. 1996, pp. 488–490.

Ned S. Wingreen, et al., "Quantum–Dot Cascade Laser: Proposal for an Ultralow–Threshold Semiconductor Laser," IEEE Journal of Quantum Electronics, vol. 33, No. 7, Jul. 1997, pp. 1170–1173.

Levi, "Infrared Laser Demonstrates a New Principle of Operation," Physics Today, Jul. 1994, pp. 20–22.

C.F. Hsu, et al., "Intersubband Laser Design Using A Quantum Box Array," SPIE Proceedings 3001, Feb. 1997, pp. 1–11.

Primary Examiner—Rodney Bovernick
Assistant Examiner—Quyen Phan Leung
Attorney, Agent, or Firm—Foley & Lardner

[57] ABSTRACT

An intersubband quantum box laser structure includes an active structure having a two dimensional array of quantum boxes separated from one another in a semiconductor matrix. The quantum boxes are formed to suppress phonon-assisted transitions, and thus the transitions become primarily of the radiative type. Each quantum box has a multilayer structure including an electron injector, an active region with a quantum well, and an electron mirror. Electrons injected from the injector into the active region at a high energy level relax to a lower energy level with the emission of a photon at, for example, mid-infrared wavelengths. The mirror reflects electrons at the higher energy level at which they were injected and transmits electrons at the lower energy level after emission of a photon. Multiple layers of semiconductor are formed on each side of the active structure to provide conduction across the multiple layer structure and to provide optical confinement of the photons emitted. The semiconductor laser structure may be formed using various material systems, including InGaAs/InGaAsP structures grown on GaAs and InGaAs/AlInAs structures grown on InP.

23 Claims, 10 Drawing Sheets

INTERSUBBAND QUANTUM BOX SEMICONDUCTOR LASER

FIELD OF THE INVENTION

This invention pertains generally to the field of semiconductor lasers and particularly to intersubband semiconductor lasers.

BACKGROUND OF THE INVENTION

Semiconductor lasers are formed of multiple layers of semiconductor materials. The conventional semiconductor diode laser typically includes an n-type layer, a p-type layer and an undoped layered active structure between them such that when the diode is forward biased electrons and holes recombine within the active structure with the resulting emission of light. The layers adjacent to the active structure typically have a lower index of refraction than the active structure and form cladding layers that confine the emitted light to the active structure and sometimes to adjacent layers. Semiconductor lasers may be constructed to be either edge emitting or surface emitting.

A semiconductor laser that emits photons as electrons from within a given energy band cascade down from one energy level to another, rather than emitting photons from the recombination of electrons and holes, has been reported by a group at AT&T Bell Laboratories. See, J. Faist, F. Capasso, D. L. Sivco, C. Sirtori, A. L. Hutchinson, and A. Y. Cho, Science, Vol. 264, pp. 553, et seq., 1994. This device, referred to as a quantum cascade laser (QCL), is the first reported implementation of an intersubband semiconductor laser. The basic light-generation mechanism for this device involves the use of 25 active regions composed of 3 quantum wells each. Injection by resonant tunneling occurs in the energy level (level 3) of the first, narrow quantum well. A radiative transition occurs from level 3, in the first well, to level 2, the upper state of the doublet made by two coupled quantum wells. Quick phonon-assisted relaxation from level 2 to 1 insures that level 2 is depleted so that population inversion between levels 3 and 2 can be maintained. Electrons from level 1 then tunnel through the passive region between active regions, which is designed such that, under bias, it allows such tunneling to act as injection into the next active region.

Lasing for such devices has been reported at 4.6 $\mu$m up to 125K with threshold-current densities in the 5 to 10 kA/cm$^2$ range. F. Capasso, J. Faist, D. L. Sivco, C. Sirtori, A. L. Hutchinson, S. N. G. Chu, and A. Y. Cho, Conf. Dig. 14th IEEE International Semiconductor Laser Conference, pp. 71–72, Maui, Hi. (Sep. 19–23, 1994). While achieving intersubband lasing in the mid- to far-infrared region, the thresholds were two orders of magnitude higher than "state-of-the-art" practical diode lasers. The reason for the high thresholds is that the transition from level 3 to 2 is primarily nonradiative. The radiative transition, with momentum conservation, has a lifetime, $T_R$, of about 26 ns, mostly due to the fact that it involves tunneling through the barrier between the first and second quantum well. By contrast, the phonon-assisted transition, $T_{32}$, has a relatively short lifetime, i.e., $T_{32} \approx 4.3$ ps. As a result, phonon-assisted transitions are about 6000 times more probable than photon-assisted transitions; that is, the radiative efficiency is 1.6× 10$^{-4}$, which explains the rather high thresholds.

Faist, et al. proceeded to improve their QCL device by making two-well active regions with a vertical transition in the first well, and providing a multi-quantum barrier (MQB) electron reflector/transmitter (mirror). J. Faist, F. Capasso, C. Sirtori, D. L. Sivco, A. L. Hutchinson, and A. Y. Cho, Appl. Phys. Lett., 66, 538, (1995). As a result, the electron confinement to level 3 improved (i.e., the reflection aspect of the MQB mirror suppresses electron escape to the continuum), and threshold current densities, $J_{th}$, as low as 1.7 kA/cm$^2$ at 10K were achieved. However, the basic limitation, low radiative efficiency (~1.6×10$^{-4}$), was not improved, since phonons still dominate the level 3 to level 2 transition. Using a 2 QW active region with a vertical transition in the first well, $J_{th}$ values as low as 6 kA/cm$^2$ at 220K were obtained. J. Faist, F. Capasso, C. Sirtori, D. L. Sivco, A. L. Hutchinson, S. N. G. Chu, and A. Y. Cho, "Continuous wave quantum cascade lasers in the 4–10 $\mu$m wavelength region," SPIE vol. 2682, San Jose, pp. 198–204, 1996. Recently, an improved version of the vertical transition design has been operated pulsed at 300K, the first mid-IR laser to operate at room temperature in the 5 $\mu$m wavelength regime. J. Faist, F. Capasso, D. L. Sivco, C. Sirtori, A. L. Hutchinson, and A. Y. Cho, "Room temperature mid-infrared quantum cascade lasers," Electron. Lett., vol. 32 pp. 560–561, 1996. Despite this rapid improvement in the performance capabilities of GaInAs/InP-based QC lasers, it is unlikely that they will ever be able to operate continuous wave (cw) at 300K due primarily to the fact that their radiative efficiency is inherently poor. This poor efficiency is quantified by noting that the non-radiative LO-phonon-assisted relaxation time for the upper laser states is about 1.8 ps and the radiative relaxation time is 4.2 ns. Consequently, the reported QCL laser devices are fundamentally inefficient, and thus impractical, due to the dominance of phonon-assisted transitions.

SUMMARY OF THE INVENTION

In accordance with the present invention, semiconductor lasers are formed to provide highly efficient emission at selected wavelengths, which may lie in the mid-to far-infrared range. Such semiconductor lasers constructed to emit in the infrared range provide efficient conversion of electrical energy to electromagnetic energy at infrared wavelengths, and thus may be used as compact, efficient infrared sources for a variety of applications, such as spectrometry, measurement of gases and liquids for process control and pollution monitoring, infrared signaling, and the like. In contrast to conventional semiconductor diode lasers, in the semiconductor lasers of the present invention, which are referred to herein as intersubband quantum box lasers (or IQB lasers), the optical gain required for laser action is not provided by electron-hole recombination but by radiative transition of electrons within a given energy band from a higher to a lower energy level. These transitions take place in an array of quantum boxes which have an internal active region in which electrons make a transition from a higher to a lower energy level with the consequent emission of photons at a wavelength related to the change in energy. The quantum boxes are formed to suppress phonon-assisted transitions, and thus the transitions become primarily of the radiative type. The greatly improved radiative efficiency enables the laser of the present invention to be formed with only a single stage, or a few stages at most, rather than many stages, resulting in a low threshold current density for lasing action, which is required for a commercially practical laser.

The semiconductor laser of the present invention is formed of multiple layers of semiconductor material which include an active region with a quantum well layer at which light emission occurs. The active region is formed in the quantum boxes, which are embedded in a matrix semiconductor to form an array of quantum boxes. Each quantum box has a multiple layer structure that includes an electron injector, which may be comprised of graded or multiple semiconductor layers, an active region adjacent to the injector having one or more quantum well layers at which electrons injected from the injector into the active region at a high energy level make a transition to a lower energy level with the emission of a photon, and an electron mirror adjacent to the active region opposite the injector. The mirror may be comprised of multiple semiconductor layers which are formed to have a gap with a low transmission at the energy level of high energy electrons injected into the active region to reflect such electrons back into the active region, and a band with a high transmission at the energy level of lower energy electrons. For typical semiconductor material systems, the quantum boxes will have lateral dimensions less than 1000 angstroms (Å) and preferably less than about 600 Å. The spacing between adjacent quantum boxes in the two dimensional array is also less than 1000 Å and preferably less than about 600 Å. Current blocking semiconductor material is formed in the matrix between the quantum boxes to confine current to the quantum boxes.

The semiconductor structure of the laser of the invention includes an active structure containing the two-dimensional (2D) array of quantum boxes (and the current blocking material between the boxes), layers on each side of the active layer to provide conduction across the active structure, and optical confinement or cladding layers on either side to provide optical confinement of the photons generated in the active structure. Electrodes may be formed on the top and bottom surfaces of the multilayer structure to allow connection to an external circuit to provide current flow across the structure.

For example, for structures based on GaAs material systems, the current blocking material in the active structure surrounding and separating the quantum boxes may be semi-insulating (SI) GaAs. The layers adjacent to the active structure may be n-GaAs, and the outer optical confinement layers may be n-InGaP. As noted above, each of the quantum boxes is itself a single stage multilayer structure which includes layers defining an electron injector, an active region, and a reflector. For this material system, the active region may include a quantum well (or multiple wells, if desired) formed of a layer of InGaAs between layers of InGaAsP, the electron injector may be formed of a graded region (continuously graded or multiple step graded thin layers) of InGaAsP, and the reflector may be formed of alternating layers of InGaAsP and InGaAs.

The semiconductor laser of the invention can be formed of material systems, and on substrates, such as gallium arsenide (GaAs), that are compatible with further semiconductor circuit processing. A variety of material systems in addition to GaAs, such an indium phosphide (InP), may also be utilized which can similarly be formed to have appropriate intersubband transitions.

The semiconductor lasers of the invention are also well suited to being produced using production techniques compatible with a large scale processing, such as metal-organic chemical vapor deposition (MOCVD).

Further objects, features and advantages of the invention will be apparent from the following detailed description when taken in conjunction with the accompanying drawings.

DETAILED DESCRIPTION OF THE INVENTION

Figure 1:
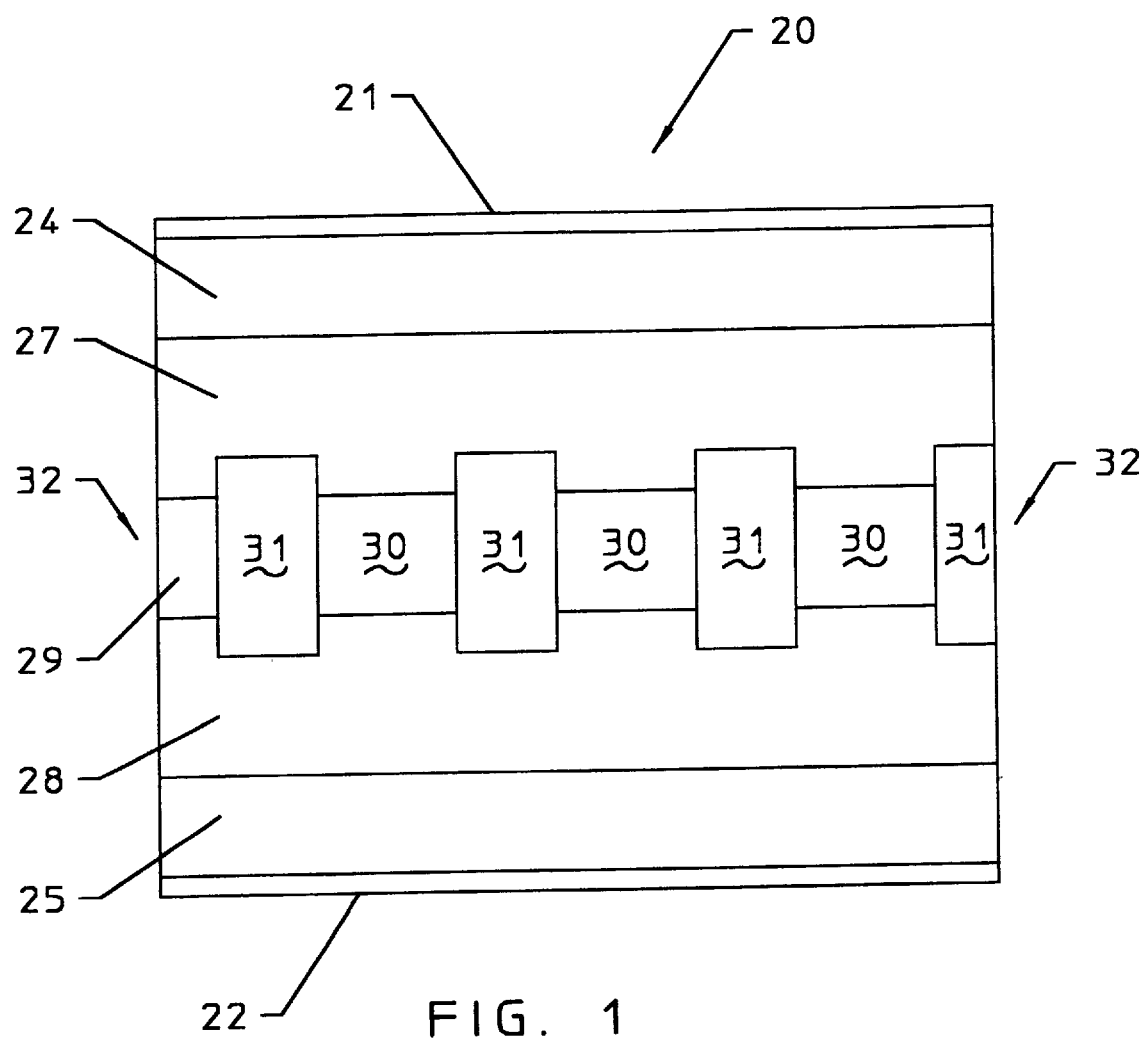
FIG. 1 is a simplified cross-sectional view through an intersubband quantum box laser in accordance with the present invention.

The present invention is a new type of laser—denoted herein as an intersubband quantum box laser (IQB laser)—which utilizes suppression of phonon-assisted energy relaxation processes to provide an efficient, low threshold and, thus, practical, intersubband laser. Suppression of phonon-assisted transitions is achieved in the present invention by utilizing appropriate quantum box structures. To facilitate an understanding of the invention, the principles underlying the effects of quantum box structures in semiconductor lasers is first discussed below.

Quantum well laser (QWL) semiconductor lasers, in which the charge carriers are confined along the growth direction in active layers (usually<30 nm thick), exhibit improved performance compared to conventional heterostructure diode lasers. The very low threshold currents achieved in QWL devices are, in part, due to a step-like density of states (DOS) and gain anisotropy caused by quantum confinement along the growth direction. Such QWL lasers are described in, e.g., W. T. Tsang, *Semiconductor and Semimetals,* Vol. 24, Academic Press (1987), ed. R. Dingle,; P. S. Zory, ed., "Quantum Well Lasers," Academic Press, (1993); H. Z. Chen, A. Ghaffair, H. Morkoc and Y. Yariv, *Electron. Lett.,* Vol. 23, pp. 1334–1335, (1987); H. K. Choi and C. A. Chen, *Appl. Phys. Lett.,* Vol. 57, pp. 321–323, (1990).

It has been proposed to quantize the electrons in more than one dimension, creating quantum wire (QWR) and quantum box (QB) laser structures, where the carriers are quantum-confined in 2 dimensions and 3 dimensions, respectively. Y. Arakawa and H. Sakaki, *Appl. Phys. Lett.,* Vol. 40, pp. 939–941, (1982). With this additional confinement, QWR and QB lasers were predicted to exhibit extremely low thresholds, higher modulation bandwidth and narrow spectral line width, and reduced temperature sensitivity by comparison to their QWL counterparts. See, e.g., A. Yariv, *Appl. Phys. Lett.,* Vol. 53, pp. 1033–1035, (1988); Y. Miyamoto, Y. Miyake, M. Asada, and Y. Suematsu, *IEEE J. Quantum Electron.,* Vol. QE-25, pp. 2001–2006, (1989); Y. Arakawa, K. Vahala, and A. Yariv, *Appl. Phys. Lett.,* Vol. 45, pp. 950–952, (1984).

QB lasers can be considered as having atom-like cells within a semiconductor. While bulk devices have the density of states (DOS) spread over a range in energy (in the conduction band), for QB devices the DOS becomes a series of delta-like functions, very much like the energy levels within an atom. The fact that quantum boxes can act as individual atoms within the semiconductor material means that they can, in principle, be unaffected by interaction with the semiconductor crystal lattice (i.e., phonons). The recombination processes which take place in quantum boxes can, in principle, produce discrete line spectra similar to those produced by excited atoms. In order for this to occur, the interactions of the carriers with phonons must be suppressed. The idea that this may be possible has been theoretically investigated by U. Bockelmann and G. Bastard, *Phys. Rev. B.,* 42, pp. 8948–8951, (1990). As the dimension, L, of the box, wire or well decreases below about 500 Å, both the LA and the LO phonon scattering rates with electrons become negligible only for QB structures. Thus, unlike 2D (quantum well) and 1D (quantum wire) structures, for which phonons dominate the intersubband transition, for 0D (quantum box) structures the transitions are purely radiative.

In accordance with the present invention, the fundamental limitation in the efficiency of QCL structures is obviated by incorporating QB structures in which photon emission occurs by intersubband transitions.

With reference to the drawings, an example of an implementation of the intersubband quantum box laser of the present invention is illustrated generally at 20 in FIG. 1, a simplified cross-sectional view through the multi-layer semiconductor structure. For purposes of illustration, the semiconductor laser structure 20 is shown with a top electrode layer 21 and a bottom electrode layer 22, both of which may be formed on the outer faces of the semiconductor structure of, e.g., conducting metal such as aluminum, gold, etc. The structure further includes top and bottom optical confinement cladding layers 24 and 25, respectively, for example, formed of n-type semiconductor. Adjacent the layers 24 and 25 are semiconductor layers 27 and 28, respectively, which are selected to provide appropriate electrical conduction across them and to have an appropriate index of refraction so as to cooperate with the layers 24 and 25 to provide optical confinement of the emitted light to the region between the layers 24 and 25. For example, where the outer layers 24 and 25 are formed of n-type InGaP, the adjacent layers 27 and 28 may be formed of n-type GaAs. Between the layers 27 and 28 is an active layer 29 containing an array of quantum boxes 30 electrically and physically isolated from each other by a semi-insulating semiconductor matrix 31. For example, the semi-insulating matrix material 31, for the material system discussed above, may comprise GaAs that is regrown after the quantum boxes have been formed. It is understood that the spacing matrix structures 31 entirely surround the quantum boxes 30 within the active layer 29 to electrically and physically isolate the quantum boxes from one another. Because the matrix 31 is semi-insulating, current flowing across the multilayer semiconductor structure between the electrodes 21 and 22 will be confined to flow through the quantum boxes 30 rather than through the semi-insulating spacer matrix 31, thereby enhancing the efficiency of utilization of the current flowing between the electrodes 21 and 22.

The utilization of the quantum box isolation structure of FIG. 1 enables carrier relaxation via phonons to be greatly reduced. The reduction of carrier relaxation via phonons typically starts to occur as the box lateral dimension (the width of a square box or the diameter of a round box) decreases below approximately 1000 Å. The intersubband transition can be made very efficient, approaching 100% radiative, providing an efficient mid-infrared (IR) laser system. The lateral dimensions of the quantum boxes 30 (i.e., the width of a square box or the diameter of a round box) are preferably less than 1000 Å, and typically these dimensions will be in the range of 300 Å to 600 Å. Using present X-ray lithography fabrication techniques, practical box dimensions of about 600 Å can be obtained. Consequently, the practical limitations of the allowable depth of a quantum box with such a width make it difficult or impossible to utilize a QCL type structure for the quantum boxes (typically, 25 two-well active regions would require a depth for each quantum box of about 9,000 Å). Practical device fabrication limitations dictate that for a quantum box having lateral dimensions in the range of 300–600 Å, the depth of the quantum box should be in the range of 400–600 Å, allowing for only one to two active regions. However, because of the very high differential gain of the quantum box laser structure, and the minimization of phonons-assisted transitions by this structure, the quantum boxes 30 of the present invention can perform satisfactorily with even a single stage and a single active region, which will nonetheless have an order of magnitude lower threshold current density than a QCL device with 25 active regions.

The semiconductor laser 20 of FIG. 1 may also incorporate conventional features for semiconductor lasers, such as reflectors for the emitted light. For example, crystal facets may be located at opposite edges of the multilayer structure 20 (e.g., reflecting facets at the side edges 32 as shown in FIG. 1) to provide reflection of the emitted light back and forth in a longitudinal direction, generally in the plane of the layers, to provide lasing action and emission of laser light from one of the facets. Lateral light containment structures may also be provided, and distributed feedback structures may be used as reflectors rather than conventional mirrors or facets. Such well known conventional structures or others may be used as a means for providing optical feedback for the semiconductor structure and consequent lasing action.

Figure 2:
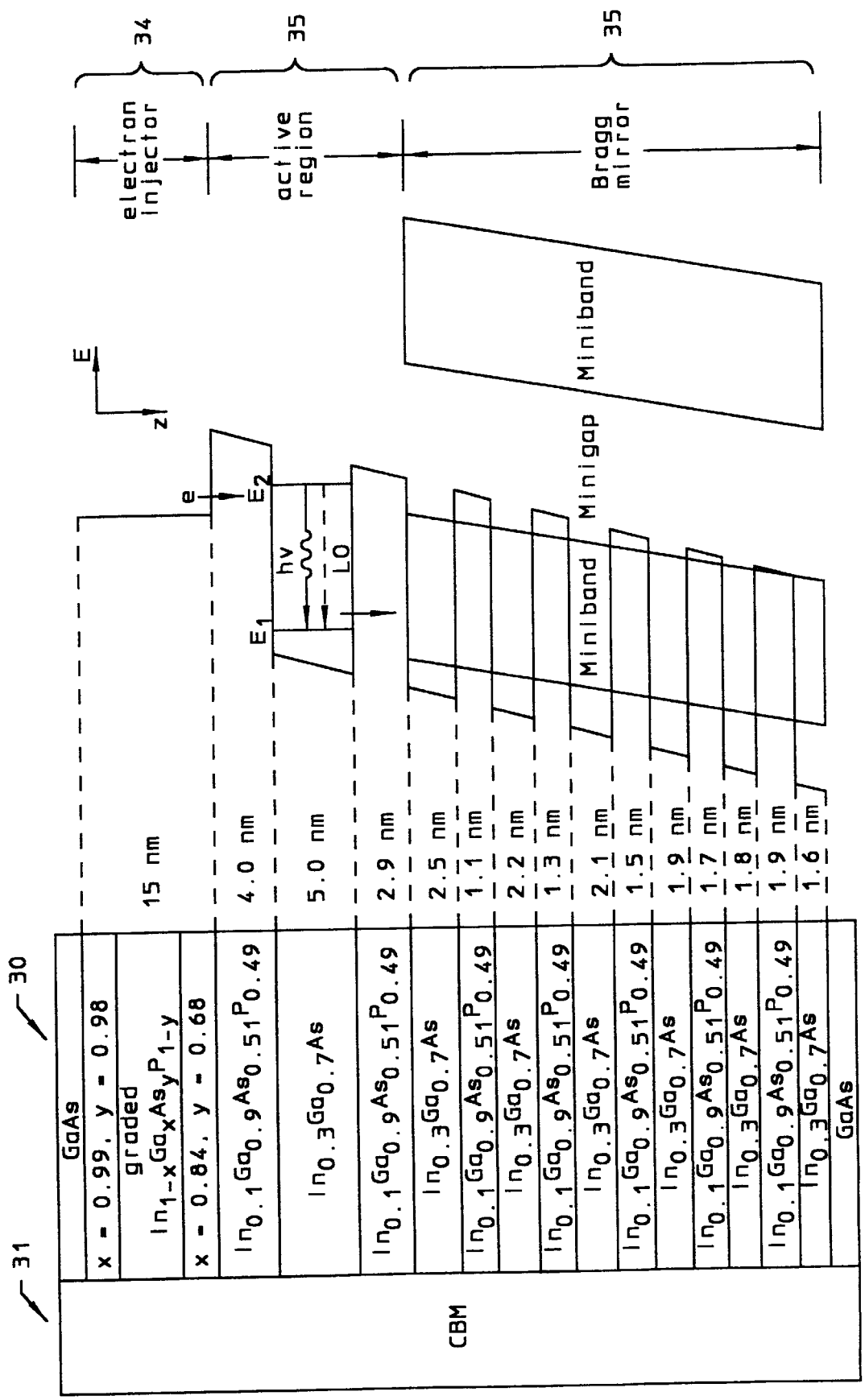
FIG. 2 is a simplified cross-sectional view of the multilayer structure of the quantum boxes in the semiconductor laser of FIG. 1, also showing an energy band diagram for this multilayer structure.
Figure 3:
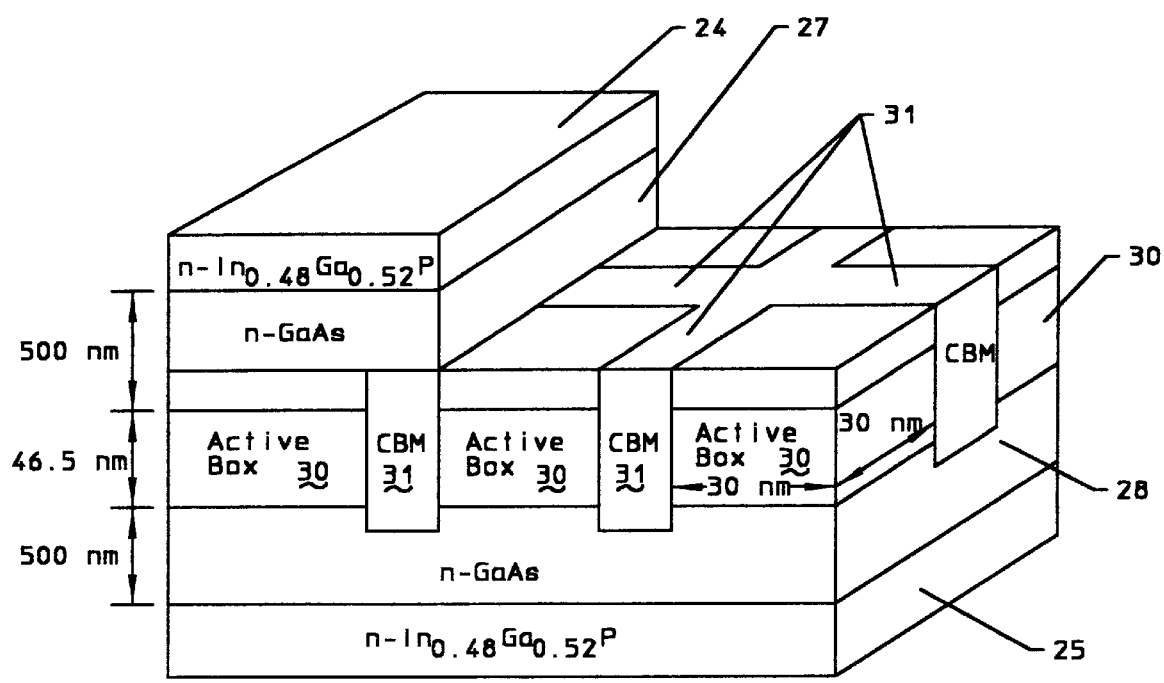
FIG. 3 is a partially cut away perspective view of an intersubband quantum box laser structure incorporating quantum boxes of the type shown in FIG. 2.

A cross-sectional view of a particular structure of the quantum boxes 30 is shown in FIG. 2 and a partial cut-away perspective view of the structure, with exemplary dimensions, is shown in FIG. 3. FIG. 2 illustrates the detailed epitaxial layer structure inside the region marked by the dashed rectangle in FIG. 3. An energy band diagram for the multilayer structure is also illustrated in the right hand side of FIG. 2. This structure comprises multiple layers forming a graded electron injector 34, an active quantum well region 35, and a distributed Bragg mirror 36 functioning as an electron reflector and transmitter.

The quantum well structure 35 has InGaAs wells under biaxial compression, and InGaAsP barriers which are lattice-matched or lattice-mismatched under tension to a GaAs substrate. It is noted that the cascade process is not needed in this structure.

The graded injector 34, which may be continuously graded InGaAsP or formed of layers of step graded InGaAsP, allows for high injection efficiency into the upper level of the quantum well. It is noted that for prior QCL devices, the injectors are multi-quantum well (MQW) structures (so-called "digitally" graded structures) that are used because of the ease of growth of such structures by molecular beam-epitaxy and the need to have a distributed Bragg reflector as a mirror-like structure for electrons injected in the energy level $E_3$ of the prior active region. In the present invention, because only a single stage is required, the electron injector 34 can be designed for excellent efficiency as an electron injector without being constrained by its characteristics as an electron Bragg mirror. An injector containing a continuous or a step-graded InGaAsP structure, which can be produced by metal-organic chemical vapor deposition (MOCVD), offers significantly less injected-carrier scattering than the complex MQW injectors of QCL structures, and thus permits highly efficient injection into the upper quantum-well energy states.

The electron reflector 36, formed of multiple alternating layers of InGaAsP and InGaAs, acts as a Bragg reflector for electrons escaping at energy level $E_2$ from the active region, and acts as a resonant tunneling structure for electrons escaping from energy level $E_1$ to the continuum. If the mirror 36 is properly placed with respect to the active region, a standing wave is created which prevents electron escape to the continuum from energy level $E_2$.

The following summarizes the actions of the structure of FIG. 2:

(a) Electrons, after being accelerated under bias across the graded InGaAsP structure 34, are injected into level 2 ($E_2$) via resonant tunneling. They cannot escape to the continuum, because, for a properly designed mirror 36, the transmission is practically zero for the energy level $E_2$. The mirror 36 is preferably designed so that when biased properly, low energy electrons from level $E_1$ can resonantly tunnel out of the structure.

(b) Electrons from the $E_2$ level decay to level $E_1$ both radiatively and non-radiatively (i.e., by phonon-assisted transition).

(c) Electrons from $E_1$ resonantly tunnel through the miniband in the mirror 36 to the continuum (with a transmission coefficient of about 20%).

It is noted that, for the structure of FIG. 2, utilizing the quantum box configuration allows the electron injector 34 to be optimized independently of the mirror 36. In contrast, QCL lasers, which employ up to 25 active regions to obtain sufficient gain, have, by necessity, the same structure for both the injector and the mirror. If desired, the present invention may also be implemented with two (or more) quantum well layers in the active region.

The use of the active structure of FIG. 2 as the quantum boxes 30 in the device 20 significantly decreases the phonon-assisted transition from level $E_2$ to $E_1$, with a significant increase in the phonon-assisted transition time, making such devices much more radiatively efficient than QCL type devices. This is apparent since the threshold current density, $J_{th}$, is directly proportional to the phonon-photon branching ratio.

In the structure of FIG. 2, the single graded injector 34 provides electron injection efficiency close to 100%, significantly greater than Bragg mirrors used as injectors in QCL devices, and the virtually complete suppression of phonons by virtue of the quantum box structures 30 allows the threshold current density $J_{th}$ to be an order of magnitude lower than for QCL-type devices.

Figure 4:
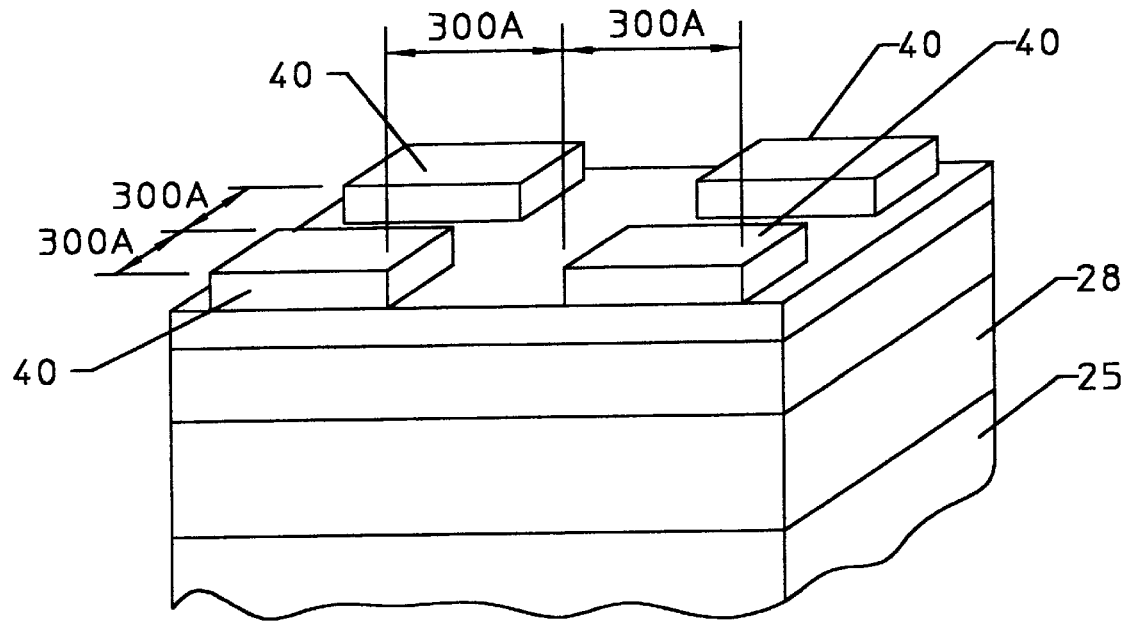
FIG. 4 is a perspective view of a part of the semiconductor structure of FIG. 3 during processing, illustrating the manner of patterning used to form the isolated quantum box structures.

The semiconductor structures of FIGS. 1–3 may be produced by conventional semiconductor processing techniques, and do not require the use of molecular beam epitaxy for implementation. For example, by utilizing in situ etch and regrowth, in a state-of-the-art MOCVD reactor, defect-free rectangular boxes can be fabricated, and the quantum-box patterns can be defined employing X-ray lithography. The fabrication of such structures is illustrated with respect to FIGS. 4 and 5. With reference to FIG. 4, the multilayer structures 34–36 of FIGS. 2 and 3 are grown by the etch and regrowth technique in an MOCVD reactor on the surface of the layer 28 (e.g., n-InGaAsP). An array of, e.g., 300 Å-wide $SiO_2$ squares with, e.g., 600 Å spacing between the squares, is formed on the layers 34–36 utilizing, for example, X-ray lithography techniques. The pattern has a 25% (in-plane) fill factor. A mesa-mask, capable of operating at very small gaps, may be fabricated utilizing standard X-ray lithography processing, or E-beam patterning. (E-beam patterning is likely to provide 300 Å round boxes rather than squares. The fill factor would decrease negligibly, from about 25% to about 20%.) A main advantage of X-ray lithography is that it provides very short exposure times and fast turn-arounds, even for a large area. Further, the exposure quality can be improved because it becomes possible to afford a longer writing time to pattern the original mask in an optimal way. For example, multiple passes can be employed to reduce line fluctuations in the mask pattern, at the expense of longer E-beam exposure time. Of course, the "printing" operation that follows takes only a few seconds per field. In addition, diffraction effects further smooth out the lines, and high frequency roughness is washed out in the imaging processes.

Figure 5:
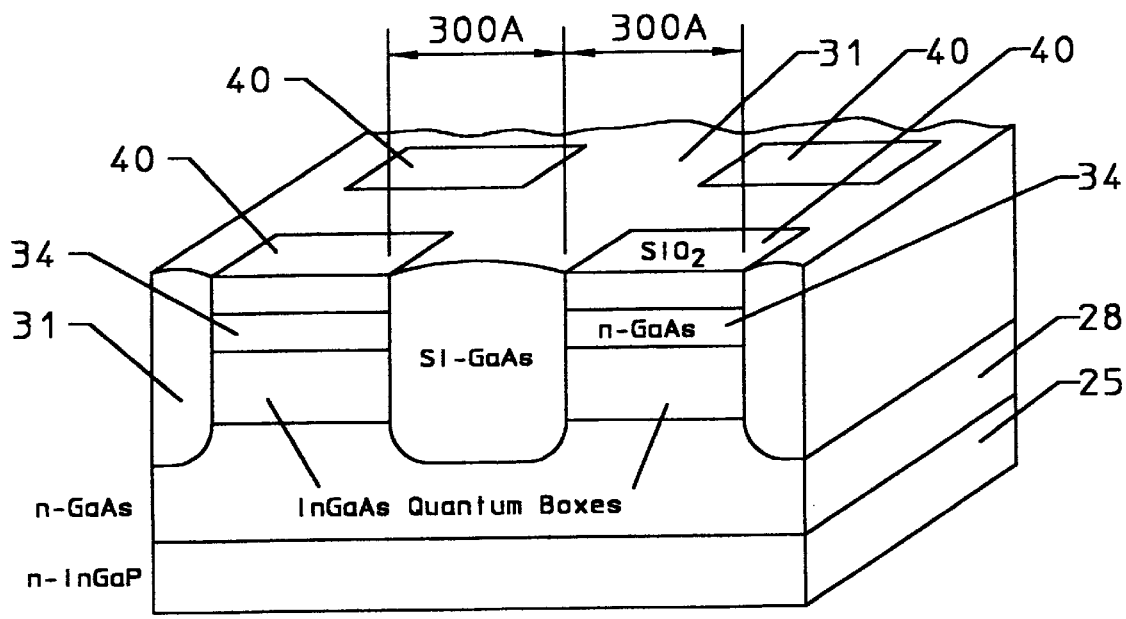
FIG. 5 is a perspective view of the semiconductor structure of FIG. 4 after a further step of processing.

The result of these processes are islands 40 of $SiO_2$, as illustrated in FIG. 4. The pattern of the "boxes" 40 is defined by X-ray lithography in a suitable X-ray photoresist (such as polymethylmethacrylate, etc.) with the resist then removed to expose the land areas between the positions of the islands 40; the $SiO_2$ between the islands 40 is then removed by dry chemical etching to leave behind the structure as shown in FIG. 4 (after removal of the covering photoresist). While box dimensions in the 300 Å range (or even less) are preferred, practical X-ray lithography techniques can readily be utilized to provide approximately 600 Å wide quantum boxes in a periodic array. The islands 40 serve as masks for preferential in situ etching through the layers 34–36 to the layer 28. Material is then regrown in the etched-out areas via metal-organic chemical vapor deposition (MOCVD) to complete the separation of the structures beneath the $SiO_2$ islands 40. As illustrated in FIG. 5, the regrown current blocking matrix material 31 may be semi-insulating (SI) GaAs. Alteratively, a back-biased high-bandgap (e.g., InGaP) p-type material and n-type material may be utilized to form a PN junction that forces the current to be confined to the quantum boxes 30. The in situ fabrication technique allows virtually defect free, lossless devices. The $SiO_2$ islands 40 are then removed by a wet chemical etching process, and a final regrowth is performed to add the layers 27 and 24 to complete the multilayer device structure.

Figure 6:
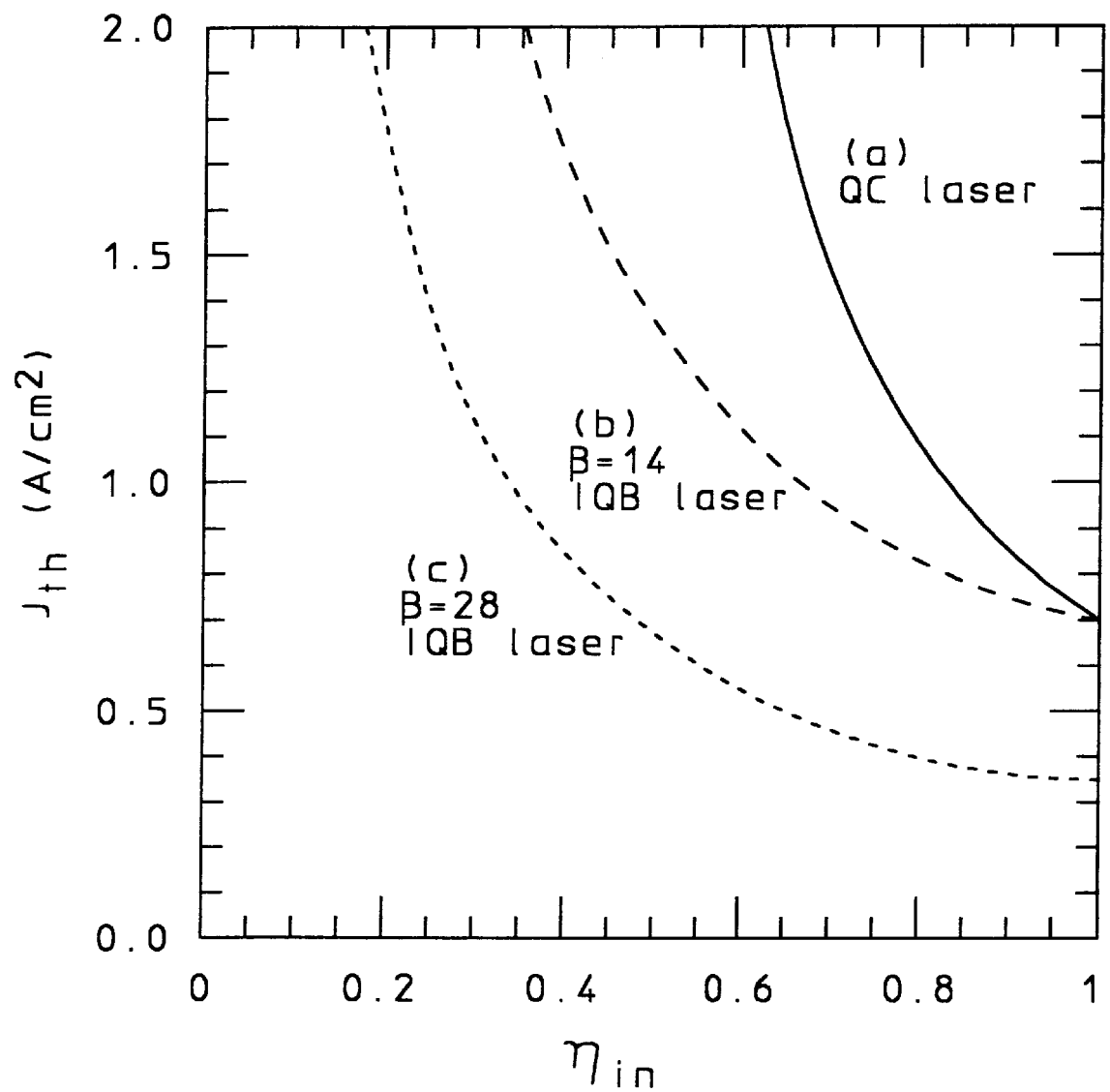
FIG. 6 is a diagram showing calculated threshold current density $J_{th}$ vs. injection efficiency $\eta_{in}$ for (a) a prior art 25-stage vertical transition QC laser; (b) a 1-stage IQB laser with photon-assisted relaxation rate suppression factor $\beta=14$ and (c) the same laser with $\beta=28$.

FIG. 6 shows the calculated threshold current density $J_{th}$ versus injection efficiency $\eta_{in}$ for the prior 25 stage vertical transition QC laser (curve (a)), and for the single stage IQB laser of FIGS. 2–3 with a phonon-assisted relaxation rate suppression factor $\beta=14$ (curve (b)) and with $\beta=28$ (curve (c)). As is apparent from FIG. 6, operation of the laser of the invention with low current density is possible, allowing continuous wave operation at room temperature.

Various semiconductor material systems may be utilized in the present invention. In general, InGaAs/InGaAsP structures grown on GaAs substrates are preferred in the present invention over the materials used in prior QCL devices, i.e., InGaAs/AlInAs lattice-matched structures grown on InP substrates. The main reasons are to maintain the system aluminum free, thus allowing for easy etch and regrowth for the fabrication of low-dimensional quantum-confinement structures (i.e., quantum boxes), to ensure long term device operation, and because a GaAs substrate is more compatible for integration than InP. Nonetheless, the invention may be implemented using InP based material systems as well as others.

Figure 7:
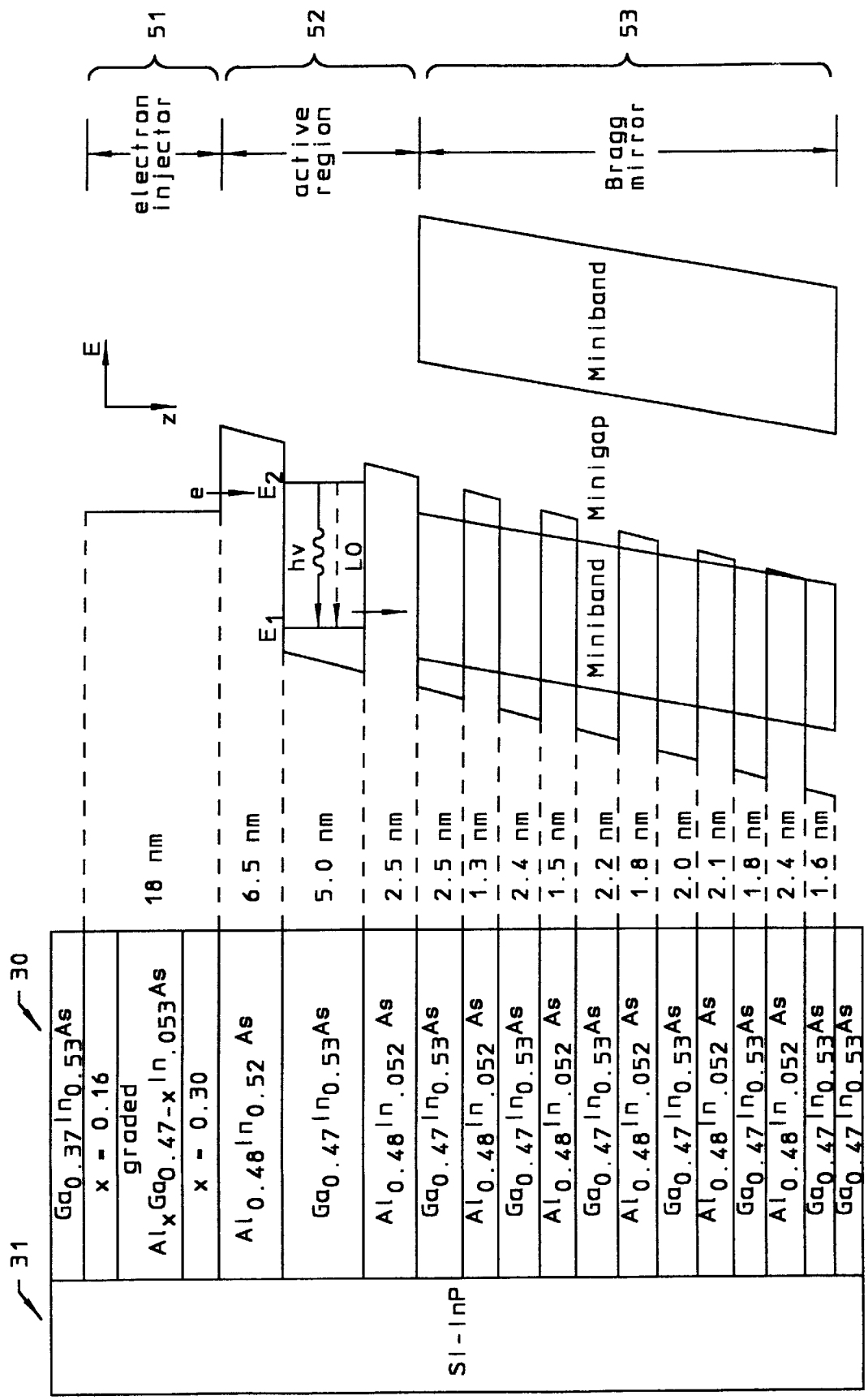
FIG. 7 is a simplified cross-sectional view of another multilayer quantum box structure for the semiconductor laser of FIG. 1, with an associated energy band diagram.
Figure 8:
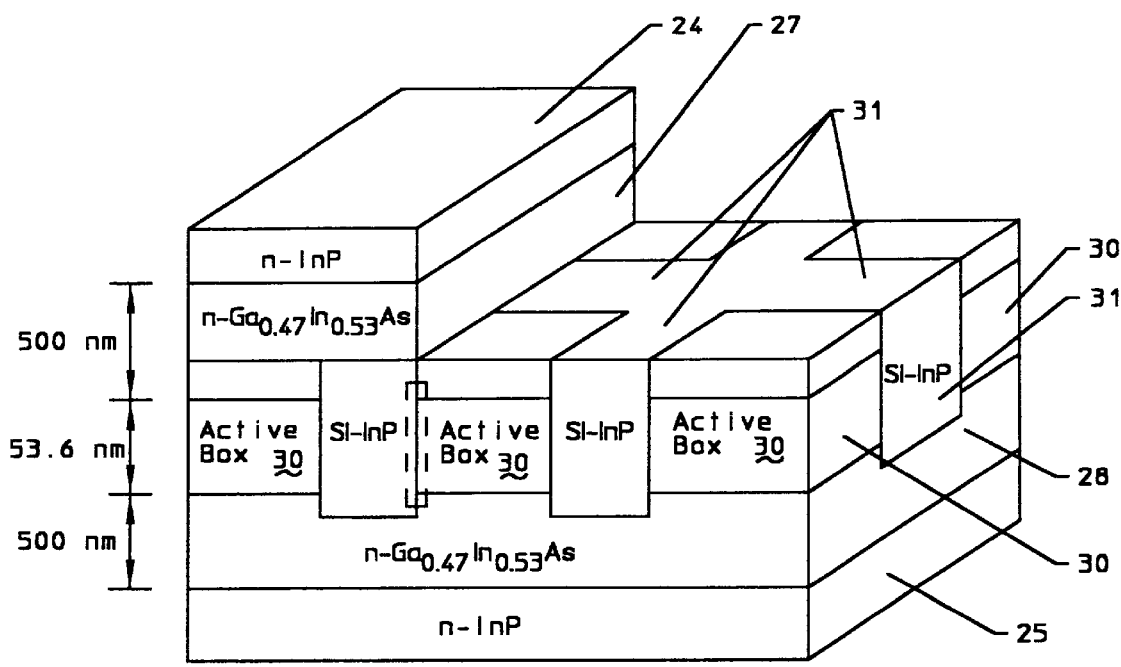
FIG. 8 is a partially cut away perspective view of an intersubband quantum box laser structure incorporating quantum boxes of the type shown in FIG. 7.

For purposes of further illustrating the present invention, the material system InGaAs/AlInAs may also be used to form IQB lasers, as shown in FIGS. 7 and 8. This is the same material system used in QCL lasers reported by Faist, et al. (1994) supra. A schematic cross-section of the layers inside the quantum box 30 (active region) and the corresponding conduction band energy diagram under positive bias $F_{th}$=85 kV/cm for this exemplary material system structure is shown in FIG. 7. The laser structure is the same as that described above with respect to the structure 20 of FIG. 1, formed on an InP substrate, with the layers 24 and 25 formed of n-type InP, the layers 27 and 28 formed of n-type GaInAs, and the separating matrix material 31 formed of InP. The quantum box structure is again subdivided into three parts as shown in FIG. 7: an electron injector 51, an active region 52, and an electron Bragg mirror 53. The active region 52 has only one active A5 quantum well.

In the same manner as described above for the active regions of FIGS. 2 and 3 discussed above, electrons are first injected from the injector 51 and then tunnel through the barrier to the upper $n_z$=2 states of the laser transition. A fraction of the electrons $(1-\eta_{in})$ will lose their energy during this tunneling process and will be injected into the lower $n_z$=1 states instead of the upper $n_z$=2 states, where $\eta_{in}$ is the injection efficiency. Once an electron is injected to the $n_z$=2 state, it can make an radiative transition (both spontaneous and by stimulated emission) or a non-radiative phonon-assisted transition to the $n_z$=1 states, or it can escape from the $n_z$=2 state to the continuum without making a transition to the $n_z$=1 states. The electron Bragg mirror 53 at the end of the active region is designed so that the electrons in $n_z$=2 states will see a minigap and be reflected back to the active region, and the electrons in $n_z$=1 states will see a miniband and transport through this region easily. Thus, once electrons make a transition from $n_z$=2 to $n_z$32 1 states, they can be quickly depopulated from $n_z$=1 states in about 0.6 ps. This insures population inversion between these two states. A second well is thus not needed as long as the lifetime of the lower states is kept short by a proper design of the Bragg mirror 53.

The QCL device for the same material system has a very low gain per active layer and therefore needs 25 periods of active layers to achieve a sufficient threshold gain. This inefficiency is due to the fast LO phonon-assisted relaxation dominating in the non-radiative process. In 2D quantum well structures, the LO phonon scattering time is on the order of a few ps while the spontaneous lifetime is on the order of a few ns. The lifetime of upper level electrons will be a few ps, which is comparable to the lifetime of lower level electrons. For example, in Faist. et al., (1995) supra, the lifetime is given as 1.25 ps and 0.6 ps for the upper and lower level electrons, respectively. The population inversion is low, resulting in a low material gain for a given injection current density, which explains the rather high threshold in the QC device laser.

Unlike LA phonons, LO phonons have no continuous energy spectrum. For an OD system (using quantum boxes), the discrete electron energies inhibit any first-order LO phonon-electron scattering (i.e., one LO phonon interaction), except for the case where the energy difference between two discrete electron states involved in the transition is equal to the energy of an LO phonon. Because of the suppression of phonon-assisted relaxation, the lifetime for electrons in upper states increases and so does the population inversion. Therefore, a higher material gain will be derived from a given injection current density, and low thresholds can be expected with the gain provided by one active layer. A finite phonon scattering time can result from broadening of the electron and phonon spectra, renormalization of the phonons due to the confinement, and higher-order interaction terms (e.g., the simultaneous interaction with an LA and an LO phonon).

In QC lasers with 25 radiative stages, the electron injector for one stage functions as the Bragg mirror for the previous stage. In the IQB laser of the present invention with a single radiative stage, the electron injector and Bragg mirror can be separately optimized. For QC lasers reported to date, the electron injector is a multi-quantum-well (MQW) structure (digitally-graded injector) which acts like a pseudoquaternary AlGaInAs variable-gap alloy. Since this type of electron injector has many interfaces, it's possible that interface scattering will lead to reduced values of $\eta_{in}$ and a larger fraction of the injected electrons will end up in the lower laser level. As shown in FIG. 7, in the present invention a graded $Al_xGa_{0.47-x}In_{0.53}As$ electron injector 51 may be utilized, lattice matched to InP to minimize interface scattering and therefore increase $\eta_{in}$.

The graded electron injector is designed such that the conduction band edge is tilted at zero bias. When bias $F_{th}$ is applied, the associated built-in electric field is canceled. As a consequence, the conduction band edge of the electron injector becomes flat and nearly aligned with the $E_2$ level (see FIG. 7). Mathematically, this can be expressed as:

$$\frac{\Delta E_{c,b} - \Delta E_{c,t}}{L_{inj}} = -F_{th}$$

where $\Delta E_{c,b}$ and $\Delta E_{c,t}$ are the conduction band discontinuities with respect to the $Al_{0.48}In_{0.52}As$ tunneling barrier at the bottom and top ends of the electron injector and $L_{inj}$=18 nm is the thickness of the electron injector. The $Al_xGa_{0.47-x}In_{0.53}As$ bulk bandgap is given as $E_g(Al_xGa_{0.47-x}In_{0.53}As)$= 0.75+1.548x eV, so $E_g(Al_{0.48}In_{0.52}As)$=1.493 eV. Assuming $\Delta E_c/\Delta E_g$=0.70, then $\Delta E_c$=0.52−1.084x eV for $Al_xGa_{0.47-x}In_{0.53}As$ with respect to $Al_{0.48}In_{0.52}As$. Solving for the Al mole fraction x, we have x graded from 0.16 to 0.30, from top to bottom in FIG. 7.

Figure 9:
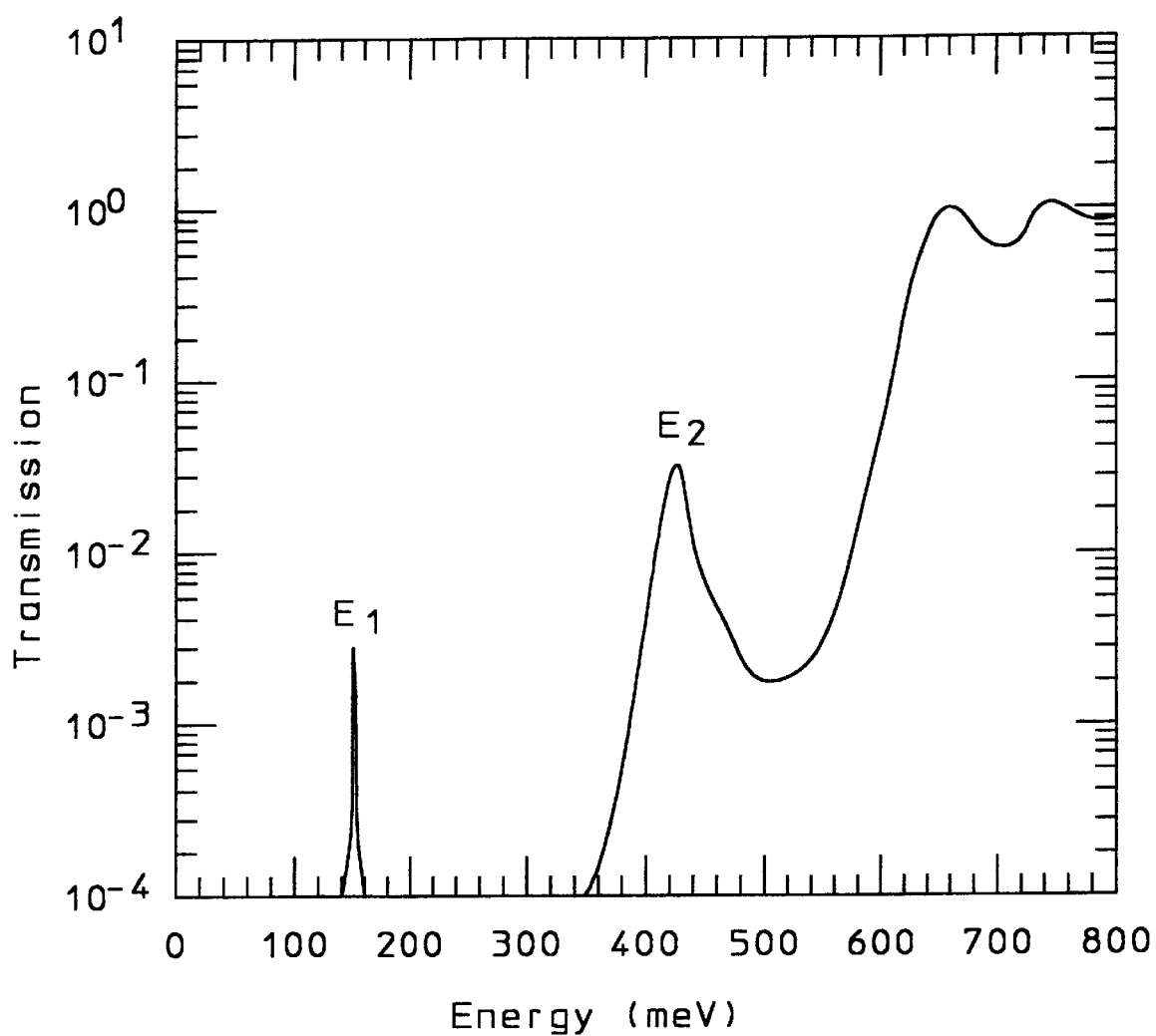
FIG. 9 is a diagram showing the calculated transmission probability as a function of electron energy for the double barrier active region of FIG. 7 under a forward bias field.

A feature of the IQB laser of the present invention is that the wavelength of photon emission is determined by quantum confinement. This allows the wavelength to be selected within a certain range by appropriately designing the width of wells and barriers of the active region on the same material system. In the IQB laser structure of FIG. 7, the active well consists of only one 5.0 nm GaInAs quantum well layer sandwiched by 6.5 nm and 2.5 nm AlInAs barrier layers (a double-barrier system). FIG. 9 shows the calculated transmission probability as a function of electron energy for the double-barrier under a forward bias field $F_{th}$ by using a multistep potential approximation. Band nonparabolicity (energy-dependent effective mass) has been taken into account in this calculation. The material parameters used are electron effective mass $m^*_c(Ga_{0.47}In_{0.53}As)=0.043\, m_o$, $m^*_c(Al_{0.48}In_{0.52}As)=0.078\, m_o$, conduction band discontinuity $\Delta E_c=0.52$ eV, and the nonparabolicity coefficient $\gamma=1.13\times 10^{-18}\, m^2$. Two peaks on the low energy side, centered at $E_1=152$ meV and $E_2=430$ meV, correspond to $n_z=1$ and $n_z=2$ states, respectively. The energy difference is $E_2-E_1=278$ meV, giving the transition wavelength as $\lambda=4.46\,\mu m$, in the mid-infrared wavelength range. The reference energy level has been chosen to be the very bottom of the 5.0 nm quantum well in FIG. 7.

The Bragg mirror 51 is formed of multiple alternating layers of GaInAs and AlInAs. As discussed above, the Bragg mirror has dual functions. It has a superlattice structure with several barrier/well pairs and acts as a reflector for $n_z=2$ electrons and a transmitter for $n_z=1$ electrons. To facilitate electrons from $n_z=1$ states transporting through the Bragg mirror, the effective conduction band edge of the Bragg mirror should be flat under the threshold electric field $F_{th}$. The effective conduction band edge $V_j$ of the jth pair of the Bragg mirror superlattices can be expressed as $$V_j \cong \Delta E_c \frac{l_{b,j}}{l_{b,j}+l_{w,j}},$$

where $\Delta E_c$ is the conduction band discontinuity between the barrier and well material (=0.52 eV), and $l_{bj}$ and $l_{wj}$ are the barrier and well widths of the jth pair. The effective conduction band edge creates a quasi-electric field which cancels the applied electric field $F_{th}$.

$$\frac{V_j-V_{j-1}}{l_{b,j}+l_{w,j}} = -F_{th}$$

Figure 10:
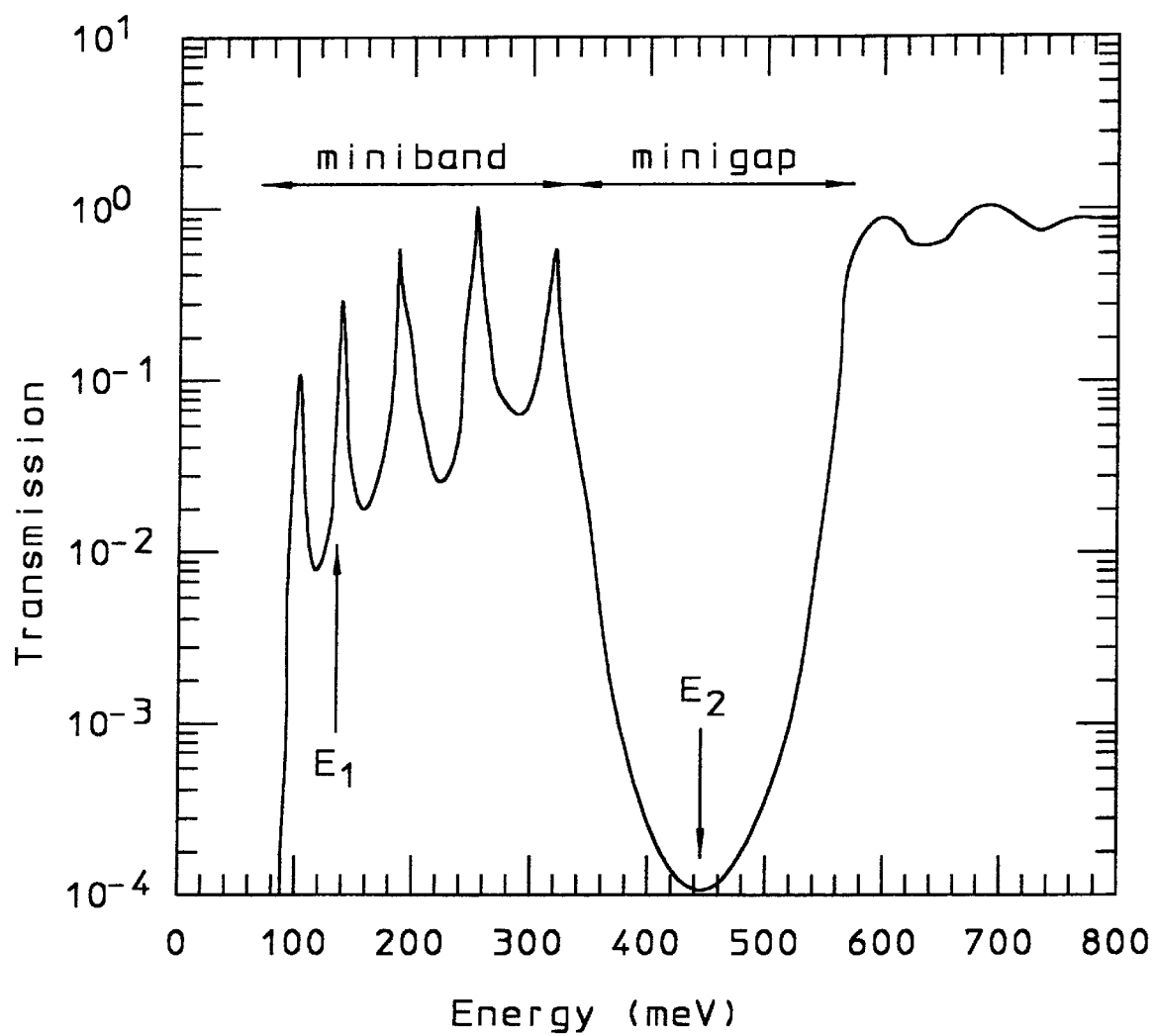
FIG. 10 is a diagram showing the calculated transmission probability as a function of electron energy for the multilayer reflector of the quantum box of FIG. 7.

Additionally, each period must obey the Bragg reflection condition, which is:

$$k_{bj}l_{bj}+k_{wj}l_{wj}=\pi,$$

where $k_{bj}$ and $k_{wj}$ are the z-direction wave vectors of electrons in the barriers and wells. Solving this set of equations iteratively for each pair $l_{bj}$, $l_{wj}$ of the Bragg mirror yields $l_{wj}$=2.5, 2.4, 2.2, 2.0, 1.8, and 1.6 nm and $l_{bj}$=1.3, 1.5, 1.8, 2.1, and 2.4 nm, from top to bottom in the Bragg mirror 53 of FIG. 7. The calculated transmission probability as a function of electron energy is shown in FIG. 10. It clearly shows a miniband (high transmission, $>10^{-1}$) facing the $n_z=1$ states, and a minigap (low transmission, $\approx 10^{-4}$) facing the $n_z=2$ states. The miniband provides a short escape time from $n_z=1$ states ($\tau_{1esc}\approx 0.6$ ps), and the minigap insures that $\tau_{2esc}$ is sufficiently long so that the escape process can be neglected.

Figure 11:
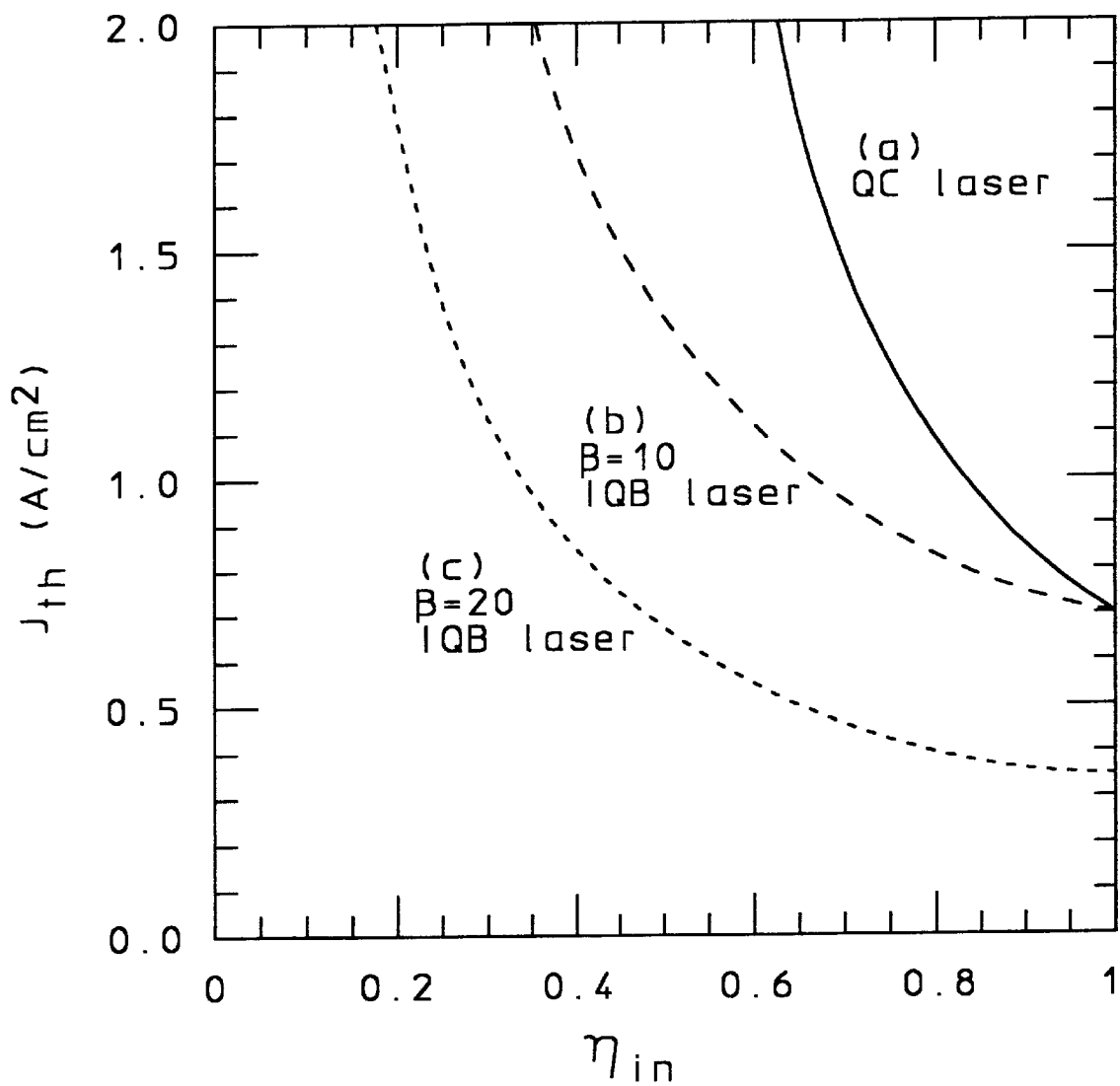
FIG. 11 is a diagram showing calculated threshold current density $J_{th}$ vs. injection efficiency $\eta_{in}$ for (a) a prior art 25-stage vertical transition QC laser; (b) a 1-stage IQB laser with photon-assisted relaxation rate suppression factor $\beta=10$, and (c) the same laser with $\beta=20$.

FIG. 11 illustrates the calculated threshold current density $J_{th}$ as a function of the injection efficiency $\eta_{in}$ for the 25-stage QC laser (a) and the one stage IQB laser with $\beta=10$ (b) and $\beta=20$ (c). comparing curve (a) to curbe (b) shows that for $\beta=10$, $J_{th}$ (IQB)=$J_{th}$ (QC) when $\eta_{in}=1$. If $\beta=20$, $J_{th}$ (IQB) as low as 0.35 kA/cm$^2$ is predicted. The curves also show that $J_{th}$ for the IQB laser is less sensitive to $\eta_{in}$ compared to the QC laser.

The present invention may be implemented in other material systems (e.g., InGaAlN) for operation at shorter wavelengths than those described herein for illustration of the invention.

It is understood that the invention is not confined to the particular embodiments set forth herein as illustrative, but embraces all such modified forms thereof as come within the scope of the following claims.

What is claimed is:

1. A semiconductor structure for lasers comprising:
multiple layers of semiconductor including an active structure in which light emission occurs, the active structure having an array of spaced quantum boxes formed in a matrix of semiconductor material, each quantum box comprising a multiple semiconductor layer structure including an electron injector, an active region adjacent to the electron injector and having a quantum well layer therein at which electrons injected from the electron injector into a high energy level of the quantum well layer relax to a lower energy level with the emission of a photon, and an electron mirror adjacent to the active region which is formed to have high reflection at the energy of the high energy electrons injected into the active region and high transmission at the energy of the lower energy electrons.

2. The semiconductor structure of claim 1 wherein lateral dimensions of the quantum boxes are less than 1000 Å.

3. The semiconductor structure of claim 1 wherein lateral dimensions of the quantum boxes are less than about 600 Å.

4. The semiconductor structure of claim 3 wherein the quantum boxes are uniformly spaced in the array in the active layer and the spacing between the quantum boxes is less than about 600 Å.

5. The semiconductor structure of claim 1 wherein the active region in the quantum boxes is formed of a quantum well layer of InGaAs between layers of InGaAsP.

6. The semiconductor structure of claim 5 wherein the electron injector is formed of graded layers of InGaAsP, the electron mirror is formed of multiple alternating layers of InGaAsP and InGaAs, and the matrix material is GaAs.

7. The semiconductor structure of claim 1 wherein the active region in the quantum boxes is formed of a quantum well layer of InGaAs between layers of AlInAs.

8. The semiconductor structure of claim 7 wherein the electron injector comprises graded layers of AlGaInAs, the electron mirror is formed as a Bragg mirror of multiple alternating layers of InGaAs and AlInAs, and the matrix material is InP.

9. The semiconductor structure of claim 1 wherein the matrix material in the active structure between the quantum boxes is formed to have low conductivity so that current flowing across the active structure will flow primarily through the quantum boxes.

10. The semiconductor structure of claim 9 wherein the matrix material between the quantum boxes in the active structure is formed to have a reverse biased p-n junction therein to inhibit current flow through the matrix material.

11. The semiconductor structure of claim 1 wherein the active region has only one quantum well layer.

12. A semiconductor laser comprising:
(a) a multilayer semiconductor structure including an active structure, cladding layers on each side of the active structure, and outer faces, and electrodes on the outer faces by which voltage can be applied across the semiconductor structure;
(b) the active structure comprising an array of spaced quantum boxes embedded in and separated by a semiconductor matrix material, each quantum box comprising a multiple semiconductor layer structure including an electron injector, an active region adjacent the injector and having a quantum well layer at which electrons injected from the injector into a high energy level of the quantum well layer relax to a lower energy level with the emission of a photon, and an electron mirror adjacent to the active region which is formed to have high reflection at the energy of the high energy electrons injected into the active region and high transmission at the energy of the lower energy electrons.

13. The semiconductor laser of claim 12 wherein lateral dimensions of the quantum boxes are less than 1000 Å.

14. The semiconductor laser of claim 12 wherein lateral dimensions of the quantum boxes are less than about 600 Å.

15. The semiconductor laser of claim 14 wherein the quantum boxes are uniformly spaced in the array in the active layer and the spacing between the quantum boxes is less than about 600 Å.

16. The semiconductor laser of claim 12 wherein the active region in the quantum boxes is formed of a quantum well layer of InGaAs between layers of InGaAsP.

17. The semiconductor laser of claim 16 wherein the electron injector is formed of graded layers of InGaAsP, the electron mirror is formed of multiple alternating layers of InGaAsP and InGaAs, and the matrix material is GaAs.

18. The semiconductor laser of claim 17 wherein there are layers adjacent to the active structure formed of n-type GaAs and the cladding layers are formed over these layers, the cladding layers comprising n-type InGaP.

19. The semiconductor laser of claim 12 wherein the active region in the quantum boxes is formed of a quantum well layer of InGaAs between layers of AlInAs.

20. The semiconductor laser of claim 19 wherein the electron injector comprises graded layers of AlGaInAs, the electron mirror is formed of multiple alternating layers of InGaAs and AlInAs, and the matrix material is InP.

21. The semiconductor laser of claim 12 wherein the matrix material in the active structure between the quantum boxes is formed to have low conductivity so that current flowing across the active structure will flow primarily through the quantum boxes.

22. The semiconductor laser of claim 21 wherein the matrix material between the quantum boxes in the active structure is formed to have a reverse biased p-n junction therein to inhibit current flow through the matrix material.

23. The semiconductor laser of claim 12 wherein the active region has only one quantum well layer.

* * * * *